United States Patent
Hasegawa et al.

(10) Patent No.: US 9,490,729 B2
(45) Date of Patent: Nov. 8, 2016

(54) MAGNETOSTRICTIVE VIBRATION POWER GENERATION DEVICE

(71) Applicant: Sumitomo Riko Company Limited, Aichi (JP)

(72) Inventors: Koichi Hasegawa, Aichi (JP); Hajime Kurikuma, Aichi (JP)

(73) Assignee: SUMITOMO RIKO COMPANY LIMITED, Aichi (JP)

( * ) Notice: Subject to any disclaimer, the term of this patent is extended or adjusted under 35 U.S.C. 154(b) by 0 days.

(21) Appl. No.: 14/744,652

(22) Filed: Jun. 19, 2015

(65) Prior Publication Data

US 2015/0288300 A1    Oct. 8, 2015

Related U.S. Application Data

(63) Continuation of application No. PCT/JP2013/084710, filed on Dec. 25, 2013.

(30) Foreign Application Priority Data

Jan. 30, 2013  (JP) .................................. 2013-016064

(51) Int. Cl.
*H02N 2/18*     (2006.01)
*H01L 41/12*    (2006.01)

(52) U.S. Cl.
CPC ............ *H02N 2/188* (2013.01); *H01L 41/125* (2013.01)

(58) Field of Classification Search
CPC ..... H02N 2/188; H01L 41/125; H01L 41/06; H01L 41/12
USPC .................................................. 310/26, 300
See application file for complete search history.

(56) References Cited

U.S. PATENT DOCUMENTS 8,093,869 B1    1/2012  Gunderson
2014/0346902 A1  11/2014  Ueno

FOREIGN PATENT DOCUMENTS

| WO | 2004/015790 | 2/2004 |
| WO | 2011/158473 | 12/2011 |
| WO | 2012/137695 | 10/2012 |
| WO | 2012/157246 | 11/2012 |

OTHER PUBLICATIONS

Search Report issued in PCT/JP2013/084710 and English language translation thereof, dated Apr. 8, 2014.
English language translation of International Preliminary Report on Patentability, dated Jul. 30, 2015.

*Primary Examiner* — Naishadh Desai
(74) *Attorney, Agent, or Firm* — Greenblum & Bernstein, P.L.C.

(57) ABSTRACT

A magnetostrictive vibration power generation device including: a longitudinal magnetostrictive element formed of a magnetostrictive material and configured to be attached to a vibrating member at at least one end part thereof; a coil wound on a closed magnetic path constituted including the magnetostrictive element; and a permanent magnet arranged so as to apply a bias magnetic field to the closed magnetic path. A yoke member formed of a magnetic material is arranged in parallel at a side of the magnetostrictive element, and the closed magnetic path is formed including the magnetostrictive element and the yoke member, the permanent magnet is attached to the yoke member on the closed magnetic path, and the yoke member is allowed relative displacement in relation to the magnetostrictive element on at least one side in a magnetic path lengthwise direction of the closed magnetic path.

9 Claims, 10 Drawing Sheets

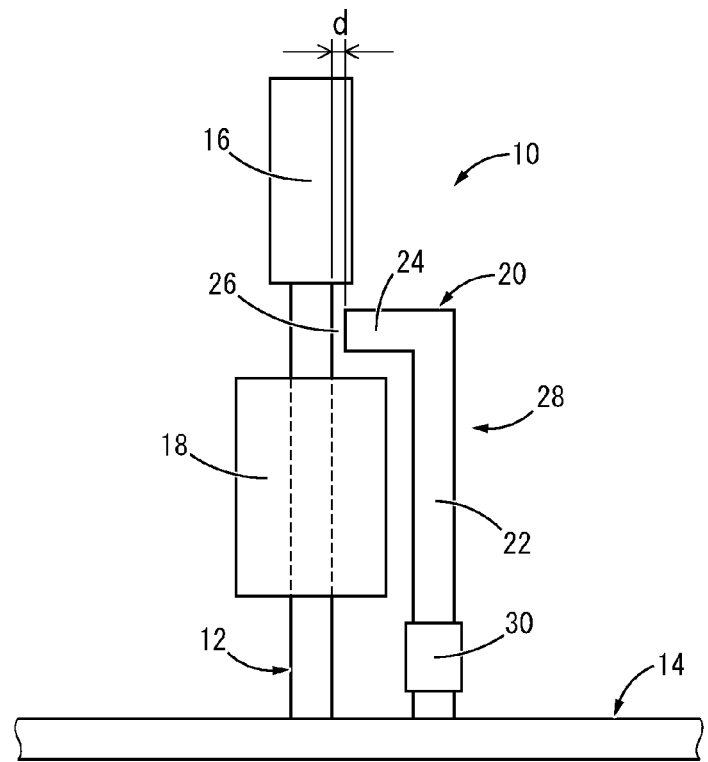
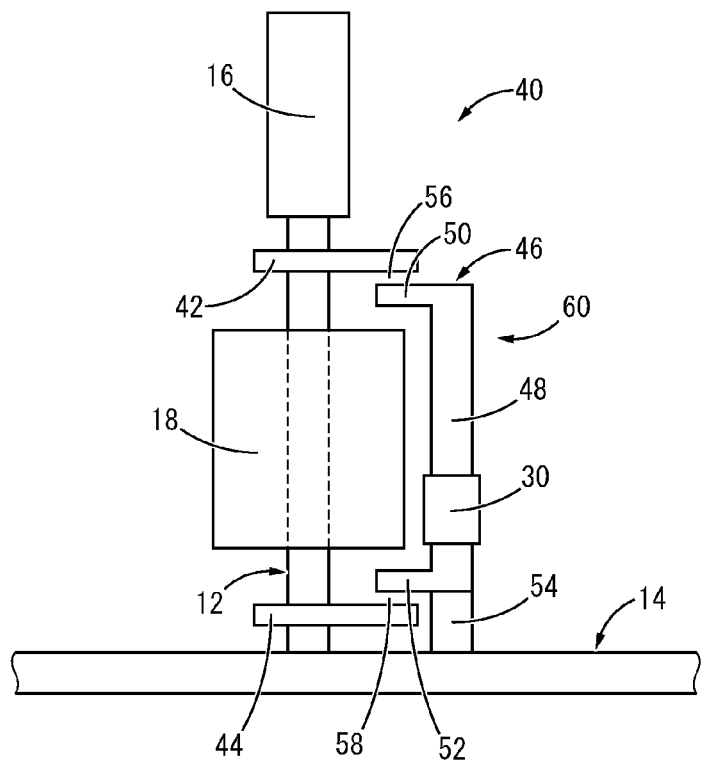

MAGNETOSTRICTIVE VIBRATION POWER GENERATION DEVICE

INCORPORATED BY REFERENCE

The disclosure of Japanese Patent Application No. 2013-016064 filed on Jan. 30, 2013, including the specification, drawings and abstract is incorporated herein by reference in its entirety. This is a Continuation of International Application No. PCT/JP2013/084710 filed on Dec. 25, 2013.

BACKGROUND OF THE INVENTION

1. Field of the Invention

The present invention relates to a vibration power generation device that generates power by converting vibration energy to electric energy, and particularly to a magnetostrictive vibration power generation device that uses a magnetostrictive effect by deformation of a magnetostrictive element.

2. Description of the Related Art

From the past, vibration power generation devices that convert vibration energy to electric energy and use it have been proposed, and research and development has been progressing to handle the increase in demand for energy saving in recent times. These vibration power generation devices are equipped with a power generating element for converting vibration energy to electric energy, but as the power generating element, in addition to piezoelectric elements, magnetostrictive elements are also used. A vibration power generation device using a magnetostrictive element, as shown in International Publication No. WO 2004/015790, for example, the structure is such that a magnetic path is formed that contains a rod shaped magnetostrictive element, a coil is wound on the magnetic path, and a permanent magnet is arranged to apply a bias magnetic field on the magnetic path.

However, with the permanent magnet, in addition to being directly fixed to the magnetostrictive element in order to apply magnetic flux to the magnetic path containing a magnetostrictive element as shown in WO 2004/015790, typically, this is also fixed to a yoke member fixed to the magnetostrictive element or the like to apply a vibrational load.

However, a typical permanent magnet formed with ferrite sintered body or the like is inferior to the load bearing capacity, so when the permanent magnet is arranged on the magnetic path for which the vibrational load is input, there is a risk of damage.

SUMMARY OF THE INVENTION

The present invention has been developed in view of the above-described matters as the background, and it is an object of the present invention to provide a magnetostrictive vibration power generation device with a novel structure which is able to avoid damage to the permanent magnet and realize an increase in durability, while effectively realizing vibration power generation using the magnetostrictive element.

A first mode of the present invention provides a magnetostrictive vibration power generation device comprising: a longitudinal magnetostrictive element formed of a magnetostrictive material and configured to be attached to a vibrating member at at least one end part thereof; a coil wound on a closed magnetic path constituted including the magnetostrictive element; and a permanent magnet arranged so as to apply a bias magnetic field to the closed magnetic path, wherein the magnetostrictive element is subjected to vibration from the vibrating member in a direction of bending deformation, a yoke member formed of a magnetic material is arranged in parallel at a side of the magnetostrictive element, and the closed magnetic path is formed including the magnetostrictive element and the yoke member, the permanent magnet is attached to the yoke member on the closed magnetic path, the yoke member is allowed relative displacement in an axis-perpendicular direction in relation to the magnetostrictive element on at least one side in a magnetic path lengthwise direction of the closed magnetic path, and the yoke member is arranged in relation to an outer circumference surface of the magnetostrictive element in a state where, during the relative displacement, a distance between parts of the yoke member and the magnetostrictive element that transmit magnetic flux is kept constant.

With the magnetostrictive vibration power generation device constituted according to this kind of first mode, by vibration being input from the vibrating member, and the magnetostrictive element being deformed, based on a reverse magnetostrictive effect, the magnetic permeability of the magnetostrictive element is made to be changed. By doing this, since the volume of magnetic flux that pierces through the coil wound on the closed magnetic path is changed, induced electromotive force is generated by electromagnetic induction, and thus, vibration energy is converted to electric energy and extracted, realizing vibration power generation.

Also, with the yoke member to which the permanent magnet is attached, since relative displacement is allowed in relation to the magnetostrictive element on at least one end in the magnetic path lengthwise direction of a closed magnetic path, it is possible to prevent the yoke member from deforming by following when the magnetostrictive element deforms. Because of that, input of a large load on the permanent magnet attached to the yoke member is prevented, and it is possible to avoid damage to the permanent magnet.

With the magnetostrictive vibration power generating device constituted according to the first mode, the yoke member is allowed relative displacement in the axis-perpendicular direction in relation to the magnetostrictive element on at least one side in a magnetic path lengthwise direction of the closed magnetic path.

With the first mode, when a bending deformation occurs in the longitudinal magnetostrictive element, by relative displacement of the magnetostrictive element and the yoke member being allowed, deformation of the yoke member arranged in parallel at the side of the magnetostrictive element is prevented, and damage to the permanent magnet is avoided. The direction in which the relative displacement of the magnetostrictive element and the yoke member is allowed is not limited to being the exact direction orthogonal to the lengthwise direction of the magnetostrictive element, and as long as it is a direction that is substantially orthogonal to the lengthwise direction of the magnetostrictive element, a small amount of slanting is allowed, and the same effect is exhibited.

A second mode of the present invention provides the magnetostrictive vibration power generation device according to the first mode, wherein a projecting part that projects toward the magnetostrictive element on the closed magnetic path is provided on the yoke member, and the projecting part is arranged with a gap in relation to the magnetostrictive element.

With the second mode, by a projecting part that projects toward the magnetostrictive element being provided on the yoke member, the magnetostrictive element and the projecting part approach each other, and by making the magnetic gap with the closed magnetic path smaller, it is possible to inhibit leaking of magnetic flux. At the same time, the part arranged in parallel at the side of the magnetostrictive element with the yoke member and the distance with the magnetostrictive element can be set freely. Therefore, it is possible to apply an effective bias magnetic field using a permanent magnet with a relatively weak magnetic force, and to avoid having the shape and size of the coil and permanent magnet arranged on the closed magnetic path from being restricted by the distance between the magnetostrictive element and yoke member that extend in parallel, so it is possible to advantageously realize the target power generating performance and the like.

A third mode of the present invention provides the magnetostrictive vibration power generation device according to the second mode, wherein the gap formed between the magnetostrictive element and the projecting part has a size such that the magnetostrictive element and the projecting part are kept in a separated state during normal vibration input assumed for the vibrating member.

With the third mode, in the normal vibration state of the vibrating member, abutment of the magnetostrictive element and the projecting part is avoided, so having the yoke member deform following the magnetostrictive element is prevented, and it is possible to avoid damage to the permanent magnet. It is preferable to set the gap to be as small as possible within the range for which the magnetostrictive element and the projecting part do not abut during normal vibration input, and by doing this, the magnetic gap of the closed magnetic path is small, and it is possible to apply an effective bias magnetic field with a small permanent magnet.

A fourth mode of the present invention provides the magnetostrictive vibration power generation device according to the second or third mode, wherein an insertion hole is formed in the projecting part, and the magnetostrictive element is inserted through the insertion hole with the gap.

With the fourth mode, by the deformation of the magnetostrictive element, when the outer circumference surface of the magnetostrictive element and the inner circumference surface of the insertion hole are separated on a portion of the circumference, the outer circumference surface of the magnetostrictive element and the inner circumference surface of the insertion hole approach each other at another portion on the circumference. By doing this, with the closed magnetic path, changes in the magnetic gap due to deformation of the magnetostrictive element are reduced overall, and the power generating efficiency is stabilized.

A fifth mode of the present invention provides the magnetostrictive vibration power generation device according to the first mode, wherein a projecting part that projects toward the magnetostrictive element on the closed magnetic path is provided on the yoke member, and the projecting part is in sliding contact so as to be capable of relative displacement in relation to the magnetostrictive element.

With the fifth mode, the yoke member and the magnetostrictive element are in contact, so even with a permanent magnet with relatively small magnetic force, it is possible to obtain an effective bias magnetic field. Therefore, it is possible to make the permanent magnet smaller and lower in cost.

A sixth mode of the present invention provides the magnetostrictive vibration power generation device according to any one of the first through fifth modes, wherein both end parts of the magnetostrictive element are configured to be attached to the vibrating member.

With the sixth mode, by deformation of the vibrating member, a strong force is applied between both end parts of the magnetostrictive element, so compared to when the magnetostrictive element is deformed only by the resonance phenomenon of the natural vibration of the magnetostrictive element, stable power generation is possible without the frequency of the input vibration being affected.

A seventh mode of the present invention provides the magnetostrictive vibration power generation device according to any one of the first through sixth modes, wherein a longitudinal rigid member separate from the yoke member is arranged in parallel at the side of the magnetostrictive element, and both end parts of the rigid member are coupled to the magnetostrictive element.

With the seventh mode, during vibration input in the direction in which the magnetostrictive element and the rigid member are aligned, compression strain and tensile strain in the axial direction are alternately input to the magnetostrictive element, so power generation based on the reverse magnetostrictive effect is efficiently realized.

An eighth mode of the present invention provides the magnetostrictive vibration power generation device according to any one of the first through seventh modes, wherein a mass-spring vibration system is constituted by a mass member being configured to be coupled to the vibrating member by a rubber elastic body, and the magnetostrictive element is configured to be attached to the vibrating member via the vibration system by at least one end part of the magnetostrictive element being fixed to the mass member.

With the eighth mode, the mass member to which the magnetostrictive element is attached constitutes the mass-spring vibration system, and based on a vibration amplifying effect by resonance of the mass-spring vibration system or the like, a larger vibration than the vibration of the vibrating member can be applied to the magnetostrictive element. By doing this, more than when the magnetostrictive element is directly fixed to the vibrating member for attachment, for example, it is possible to obtain a larger power generation volume at least with the vibration amplification frequency range with the mass-spring vibration system.

In particular with this mode, one vibration system is constituted for which the magnetostrictive element also undergoes vibration deformation in relation to the mass-spring vibration system using the mass member and the rubber elastic body, and since a plurality of these vibration systems are arranged in series in the vibration transmission system from the vibrating member and constitute a vibration system with a high degree of freedom, it is possible to have an even greater degree of freedom for tuning. As a result, for example, it is possible to have even greater vibration magnification with the magnetostrictive element, and it is possible to apply a large vibration deformation to the magnetostrictive element in relation to the vibration of a wide frequency range or a plurality of frequency ranges, so excellent power generating efficiency is realized.

A ninth mode of the present invention provides the magnetostrictive vibration power generation device according to the eighth mode, wherein a natural frequency of the magnetostrictive element is set to a frequency range of $\pm\sqrt{2}$ times in relation to a natural frequency of the mass-spring vibration system.

With the ninth mode, by combining the vibration of the magnetostrictive element and the vibration of the mass-spring vibration system, it is possible to more easily perform tuning of the vibration applied from the vibrating member or the like for which, for example, vibration deformation is applied to the magnetostrictive element at a large vibration magnification for a plurality of frequency ranges or a wide frequency range or the like corresponding to the vibration input from the vibrating member.

With the present invention, the yoke member arranged in parallel at the side of the magnetostrictive element can be relatively displaced in relation to the magnetostrictive element at least at one side of the magnetic path lengthwise direction of the closed magnetic path in relation to the magnetostrictive element, so even if the magnetostrictive element is deformed by vibration input, deformation of the yoke member is reduced or avoided, and damage to the permanent magnet attached to the yoke member is prevented.

BRIEF DESCRIPTION OF THE DRAWINGS

The foregoing and/or other objects, features and advantages of the invention will become more apparent from the following description of a preferred embodiment with reference to the accompanying drawings in which like reference numerals designate like elements and wherein:

FIG. 1 is a front view schematically showing a magnetostrictive vibration power generation device as a first embodiment of the present invention;

FIG. 2 is a front view schematically showing a magnetostrictive vibration power generation device as a second embodiment of the present invention;

FIG. 6A shows the state with vibration not input, FIG. 6B shows the state with a mass member displaced to the left side, and FIG. 6C shows the state with the mass member displaced to the right side;

DETAILED DESCRIPTION OF PREFERRED EMBODIMENTS

Figure 3:
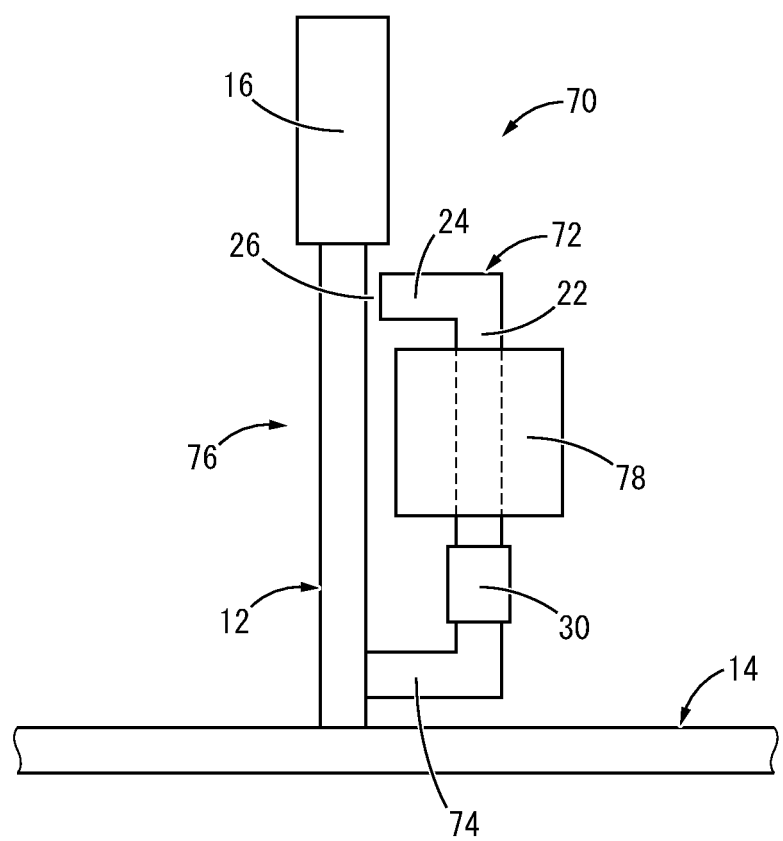
FIG. 3 is a front view schematically showing a magnetostrictive vibration power generation device as a third embodiment of the present invention.

Following, we will describe embodiments of the present invention while referring to the drawings.

FIG. 1 shows a magnetostrictive vibration power generation device 10 (hereafter called "vibration power generation device 10") as a first embodiment of the present invention. The vibration power generation device 10 is equipped with a magnetostrictive element 12 as a power generating element that converts vibration energy to electric energy. With the description hereafter, the vertical direction means the vertical direction in FIG. 1 as a rule.

In more detail, the magnetostrictive element 12 is formed of a magnetostrictive material and has a longitudinal shape extending in a straight line in the vertical direction, and with this embodiment, has a solid rod shape extending at the small diameter circular cross section. The forming material of the magnetostrictive element 12 is not particularly restricted as long as it is an item for which sufficient change of magnetic permeability can occur in relation to deformation, but an iron type magnetostrictive material which has excellent strength is preferable, and for example, an iron-gallium alloy, iron-cobalt alloy, iron-nickel alloy, terbium-dysprosium-iron alloy or the like can be optimally used.

Also, with the magnetostrictive element 12, one end part in the lengthwise direction is fixed to a vibrating member 14 of a vehicle body or the like, and the other end part of the lengthwise direction is fixed to a mass member 16. The mass member 16 is arranged in serial in the lengthwise direction in relation to the magnetostrictive element 12, and is formed using a material with a large specific gravity such as iron or the like. With this embodiment, the vibrating member 14 is formed using a magnetic material.

Furthermore, at the middle part in the lengthwise direction of the magnetostrictive element 12, a coil 18 is wound, and both end parts of the coil 18 are electrically connected to an electrical storage device such as a capacitor or the like (not illustrated).

Also, a yoke member 20 is arranged in parallel at the side of the magnetostrictive element 12. The yoke member 20 is formed of a magnetic material such as iron or the like, and is integrally equipped with a main unit part 22 separated from the magnetostrictive element 12 and extending roughly in parallel to it, and a projecting part 24 projecting toward the magnetostrictive element 12 from the axially top end part of the main unit part 22. Also, by having the yoke member 20 and the vibrating member 14 formed using a magnetic material, a closed magnetic path 28 of this embodiment is formed including the magnetostrictive element 12, the yoke member 20, and the vibrating member 14. In this way, since the closed magnetic path 28 is constituted including the magnetostrictive element 12, a coil 18 is wound and arranged on the closed magnetic path 28.

Furthermore, with the yoke member 20 of this embodiment, while the bottom end part is fixed to the vibrating member 14, and this is coupled to the magnetostrictive element 12 via the vibrating member 14, the top end part is a free end, and relative displacement in relation to the magnetostrictive element 12 is allowed. Specifically, the projecting part 24 of the yoke member 20 projects toward the magnetostrictive element 12 and approaches the magnetostrictive element 12, and is of a projection length that does not reach as far as the magnetostrictive element 12, and the projection tip end surface of the projecting part 24 is in opposition to the side surface of the magnetostrictive element 12 with a designated gap 26. Also, the top end part of the yoke member 20 which has the projecting part 24 is allowed relative displacement in the axis-perpendicular direction in relation to the magnetostrictive element 12 by the gap 26. With the yoke member 20 of this embodiment, at the top end part, relative displacement is allowed not only in the axis-perpendicular direction, but relative displacement is also allowed in the axial direction.

With this embodiment, the size of the gap 26, specifically, the distance: d between the tip end surface of the projecting part 24 of the yoke member 20 and the side surface of the magnetostrictive element 12 which are opposed to each other is the size such that, during normal vibration input assumed for the vibrating member 14, the projecting part 24 and the magnetostrictive element 12 are kept in a separated state without abutting. Of course, the size of the gap 26 is set as appropriate according to the strength of the desired bias magnetic field, the strength of a permanent magnet 30 or the like, and is not particularly restricted.

Furthermore, the permanent magnet 30 is attached to the yoke member 20. The permanent magnet 30 is a typical item formed using a ferrite sintered body or the like, for example, and has a roughly round pillar shape and is magnetized in the axial direction. With this embodiment, the main unit part 22 of the yoke member 20 is divided at the lengthwise direction middle part, a permanent magnet 30 is arranged between the divided units of the main unit part 22, and is fixed to the yoke member 20 with a means such as adhesion, locking or the like. By doing this, the permanent magnet 30 is arranged on the closed magnetic path 28 constituted including the magnetostrictive element 12 and the yoke member 20, and a bias magnetic field is applied to the closed magnetic path 28 by the magnetic flux of the permanent magnet 30.

With the vibration power generation device 10 having the constitution as described above, in the state mounted on the vibrating member 14, by the vibration of the vibrating member 14 being input to the magnetostrictive element 12, it is possible to convert vibration energy to electric energy and extract it. Specifically, when the vibrating member 14 vibrates in the direction orthogonal to the axial direction of the magnetostrictive element 12 (the lateral direction in FIG. 1), as the compelling force of the input vibration, the mass member 16 is displaced in pendulum form. By doing this, the magnetostrictive element 12 that supports the mass member 16 is bent, and compression strain in the axial direction is applied to the inside in the bending direction of the magnetostrictive element 12, and tensile strain is applied in the axial direction to the outside. Also, based on the difference of the compression rigidity and tensile rigidity or the like in the axial direction of the magnetostrictive element 12, a change occurs in the magnetic permeability due to the reverse magnetostrictive effect with the magnetostrictive element 12, and the volume of magnetic flux that pierces through the coil 18 changes. As a result, induced electromotive force is generated by electromagnetic induction on the coil 18, and this power is stored using an electric storage means (not illustrated). As noted previously, with the vibration power generation device 10, the vibration energy is converted to electric energy, and the electric energy stored in the electric storage means is used for the operation of various electrical devices and the like.

It is preferable to match the resonance frequency of the mass-spring system constituted by the magnetostrictive element 12 and the mass member 16 to the main vibration frequency by adjusting the spring constant of the magnetostrictive element 12 and the mass of the mass member 16. By doing this, during the main vibration input, the deformation of the magnetostrictive element 12 occurs efficiently in the resonant state, so there is an increase in power generating efficiency.

Here, the yoke member 20 is arranged separated at the side in relation to the magnetostrictive element 12, and the gap 26 is formed between the projecting part 24 and the magnetostrictive element 12, so the top end part of the yoke member 20 which is one side in the magnetic path length direction of the closed magnetic path 28 is allowed to have relative displacement in relation to the magnetostrictive element 12. By doing this, when the vibrating member 14 vibrates in the direction roughly orthogonal to the axial direction of the magnetostrictive element 12, the mass-spring system constituted bye the magnetostrictive element 12 and the mass member 16 is vibrated, while the magnetostrictive element 12 is curved and deformed, the yoke member 20 is displaced according to the vibration of the vibrating member 14, and thus deformation of the yoke member 20 by following the deformation of the magnetostrictive element 12 is prevented. In other words, with the yoke member 20, while the bottom end is fixed to the vibrating member 14, the top end is a free end, and the bending moment that acts on the main unit part 22 in relation to the vibration input from the vibrating member 14 is reduced.

This can be understood as noted below in regards to the vibration input initial state, for example. Specifically, in relation to the initial state (state with vibration not input), when vibration of the axis-perpendicular direction is input to the magnetostrictive element 12 from the vibrating member 14, the top end and the bottom end are relatively displaced in the axis-perpendicular direction by the inertia of the mass member 16, and bend deformation occurs. Meanwhile, with the yoke member 20, the projecting part 24 that is the top end part is allowed to be relatively displaced in relation to the magnetostrictive element 12, so displacement is done according to the vibration amplitude of the vibrating member 14, and the projecting part 24 approaches the magnetostrictive element 12. By doing this, the yoke member 20 is kept in its initial state with almost no deformation in relation to the axis-perpendicular direction vibration input. Because of that, large distortion occurring on the permanent magnet 30 fixed to the yoke member 20 is prevented, durability of the permanent magnet 30 is ensured, and it is possible to use an item with low strength such as a ferrite sintered body or the like as the permanent magnet 30.

In this way, the relative displacement in the axis-perpendicular direction of the yoke member 20 in relation to the magnetostrictive element 12 is allowed by the gap 26, and deformation of the yoke member 20 following the deformation of the magnetostrictive element 12 is prevented. With this embodiment, the size of the gap 26 is the size such that the projecting part 24 and the magnetostrictive element 12 are kept in a separated state without abutting during normal vibration input assumed for the vibrating member 14. Because of that, even during deformation of the magnetostrictive element 12, deformation of the yoke member 20 by abutting of the magnetostrictive element 12 and the yoke member 20 is prevented, and it is possible to prevent damage to the permanent magnet 30.

FIG. 2 shows a magnetostrictive vibration power generation device 40 as a second embodiment of the present invention. With the description hereafter, for substantially the same members and parts as the first embodiment, the same code numbers in the drawing are given, and a description of these will be omitted.

Specifically, with the vibration power generation device 40, an upper side projecting piece 42 is fixed to the axially top part of the magnetostrictive element 12, and a lower side projecting piece 44 is fixed to the axially bottom part of the magnetostrictive element 12. The upper side projecting piece 42 and the lower side projecting piece 44 are both plate shaped members formed using a magnetic material, and are fixed to the magnetostrictive element 12 projecting to the side.

Also, at the side of the magnetostrictive element 12, a yoke member 46 formed using a magnetic material is arranged in parallel. The yoke member 46 is equipped with a rod shaped main unit part 48 extending vertically, an upper projecting part 50 projecting toward the magnetostrictive element 12 from the top end of the main unit part 48, and a lower projecting part 52 projecting toward the magnetostrictive element 12 from the bottom end of the main unit part 48. The vertical dimensions of the yoke member 46 are smaller than the distance between opposed surfaces in the vertical direction of the upper side projecting piece 42 and the lower side projecting piece 44 fixed to the magnetostrictive element 12.

Furthermore, the yoke member 46 is coupled to the vibrating member 14 by a coupling unit 54 formed using a nonmagnetic material. The coupling unit 54 is formed from a nonmagnetic metal, synthetic resin, or a rubber elastic body or the like, for example.

Also, in a state with the yoke member 46 coupled to the vibrating member 14 by the coupling unit 54, the upper projecting part 50 and the lower projecting part 52 are inserted between the opposed surfaces of the upper side projecting piece 42 and the lower side projecting piece 44. Also, the upper projecting part 50 and the upper side projecting piece 42 are in opposition to each other with a gap 56, and the lower projecting part 52 and the lower side projecting piece 44 are in opposition to each other having a gap 58, and a closed magnetic path 60 is constituted by the magnetostrictive element 12 and the yoke member 46, and at both the top and bottom ends of the yoke member 46, relative displacement in relation to the magnetostrictive element 12 is allowed.

With the vibration power generation device 40 constituted in this way as well, by relative displacement of the yoke member 46 in relation to the magnetostrictive element 12 being allowed, deformation of the yoke member 46 following the deformation of the magnetostrictive element 12 is prevented, and it is possible to prevent damage to the permanent magnet 30 attached to the yoke member 46.

Also, with this embodiment, by the upper side projecting piece 42 and the lower side projecting piece 44 fixed to the magnetostrictive element 12 being arranged in opposition to the upper projecting part 50 and the lower projecting part 52 of the yoke member 46 in the axial direction, a closed magnetic path 60 is constituted. Because of that, to prevent abutting of the yoke member 46 and the magnetostrictive element 12, even when the gap in the axis-perpendicular direction for the yoke member 46 and the magnetostrictive element 12 is ensured to be sufficiently large, it is possible to set the magnetic gap of the closed magnetic path 60 to be small and to inhibit leaking of magnetic flux, and possible to obtain an effective bias magnetic field with a small permanent magnet 30.

FIG. 3 shows a magnetostrictive vibration power generation device 70 as a third embodiment of the present invention. The vibration power generation device 70 is constituted including a yoke member 72. The yoke member 72 is equipped with a rod shaped main unit part 22 arranged with a gap at the side of the magnetostrictive element 12 and extending roughly parallel, a projecting part 24 projecting toward the magnetostrictive element 12 from the top end of the main unit part 22, and a coupling support part 74 that couples the bottom end of the main unit part 22 to the magnetostrictive element 12. Also, a closed magnetic path 76 is formed by the magnetostrictive element 12 and the yoke member 72.

Furthermore, the permanent magnet 30 is fixed to the main unit part 22 of the yoke member 72 constituting the closed magnetic path 76, and a coil 78 is wound, the magnetic flux of the permanent magnet 30 is applied as a bias magnetic field to the closed magnetic path 76, and the bias magnetic field pierces through the coil 78. The coil 78 is connected to the electric storage means the same as the coil 18 with the aforementioned embodiment, and with the vibration power generation device 70 of this embodiment, the coil 18 is not wound on the magnetostrictive element 12.

With the vibration power generation device 70 with this kind of constitution as well, the projecting part 24 of the yoke member 72 is separated having a gap 26 in relation to the magnetostrictive element 12, and at one side in the magnetic path length direction of the closed magnetic path 76, relative displacement of the yoke member 72 in relation to the magnetostrictive element 12 is allowed. Because of that, deformation of the yoke member 72 along with deformation of the magnetostrictive element 12 is prevented, and damage to the permanent magnet 30 fixed to the yoke member 72 is prevented.

As is clear from this embodiment, the coil does not necessarily have to be wound on the magnetostrictive element, and if it is wound on the closed magnetic path, it can also be wound on the yoke member or other members.

Figure 4:
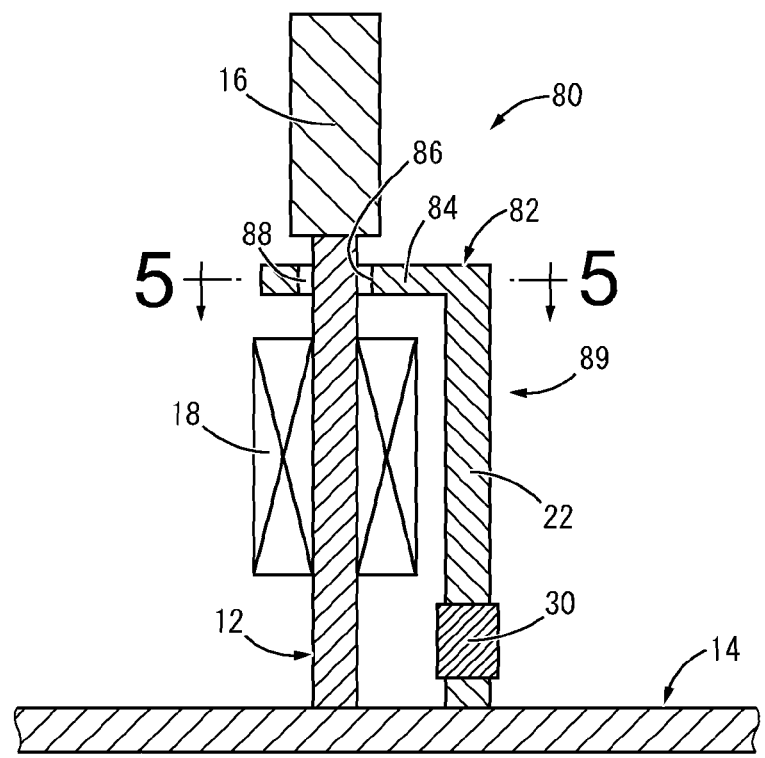
FIG. 4 is a vertical cross section view schematically showing a magnetostrictive vibration power generation device as a fourth embodiment of the present invention, taken along line 4-4 of FIG. 5.
Figure 5:
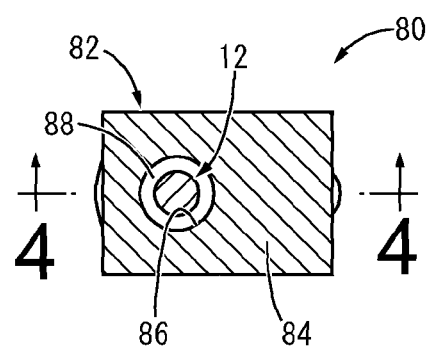
FIG. 5 is a cross section view taken along line 5-5 of FIG. 4.

FIG. 4 and FIG. 5 show a magnetostrictive vibration power generation device 80 as a fourth embodiment of the present invention. With the vibration power generation device 80, a yoke member 82 is equipped with a main unit part 22 extending in parallel with the magnetostrictive element 12, and a projecting part 84 projecting toward the magnetostrictive element 12 from the top end of the main unit part 22.

As shown in FIG. 4 and FIG. 5, the projecting part 84 has a roughly rectangular plate shape that expands in the axis-perpendicular direction, and extends out past the magnetostrictive element 12, and also, has an insertion hole 86 formed piercing through vertically, and has the magnetostrictive element 12 inserted through the insertion hole 86. This insertion hole 86 has a circular cross section with a diameter larger than the diameter of the magnetostrictive element 12, and in a state with the magnetostrictive element 12 inserted through the insertion hole 86, a ring shaped gap 88 that is continuous along the entire circumference is formed between the inner circumference surface of the insertion hole 86 and the outer circumference surface of the magnetostrictive element 12. Also, by having the magnetostrictive element 12 inserted through the insertion hole 86, a closed magnetic path 89 of this embodiment is constituted including the magnetostrictive element 12, the yoke member 82, and the vibrating member 14, and a bias magnetic field by the magnetic flux of the permanent magnet 30 is applied.

With the vibration power generation device 80 with this kind of constitution, when vibration is input in the axis-perpendicular direction from the vibrating member 14 to the magnetostrictive element 12, the magnetostrictive element 12 deforms, and the insertion position of the magnetostrictive element 12 changes in relation to the insertion hole 86. Specifically, in the state without vibration input shown in FIG. 6A, the magnetostrictive element 12 is inserted through roughly the center of the insertion hole 86. Also, when axis-perpendicular direction vibration is input from the vibrating member 14, by the magnetostrictive element 12 being elastically deformed and displaced within the insertion hole 86, as shown in FIG. 6B and FIG. 6C, the magnetostrictive element 12 is inserted through the outer circumference part of the insertion hole 86. In this way, by the gap 88 being formed along the entire circumference between the magnetostrictive element 12 and the insertion hole 86 inner circumference surface, deformation of the yoke member 82 following the deformation of the magnetostrictive element 12 is prevented, and damage to the permanent magnet 30 fixed to the yoke member 82 is avoided.

Figure 6A:
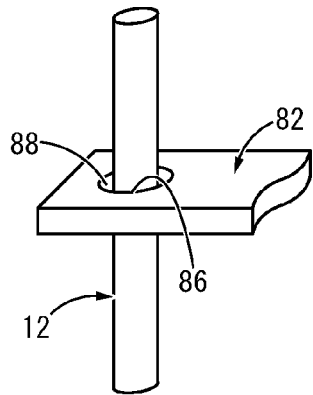
FIGS. 6A-6C are specific views suitable for explaining the operation of the magnetostrictive vibration power generation device shown in FIG. 4, where
Figure 6B:
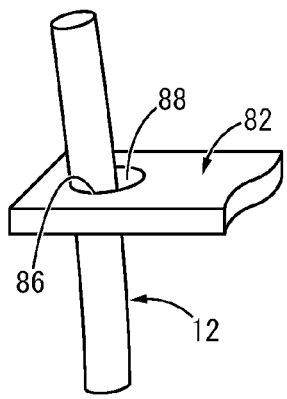
Figure 6C:
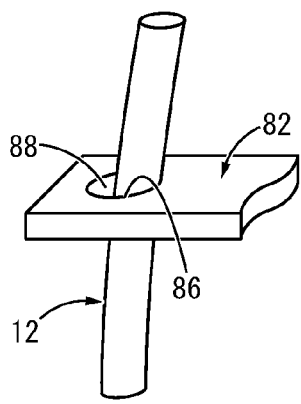

In fact, by the elastic deformation of the magnetostrictive element 12, even if the insertion position of the magnetostrictive element 12 in relation to the insertion hole 86 changes as shown in FIG. 6A to 6C, the change in the magnetic gap for the closed magnetic path is reduced, stabilizing the power generating efficiency. This is probably because even if the magnetostrictive element 12 moves away from the inner circumference surface of the insertion hole 86 at one side of the radial direction, at the other side of the same radial direction, the magnetostrictive element 12 approaches the inner circumference surface of the insertion hole 86, and the change in the magnetic gap is reduced overall.

Figure 7:
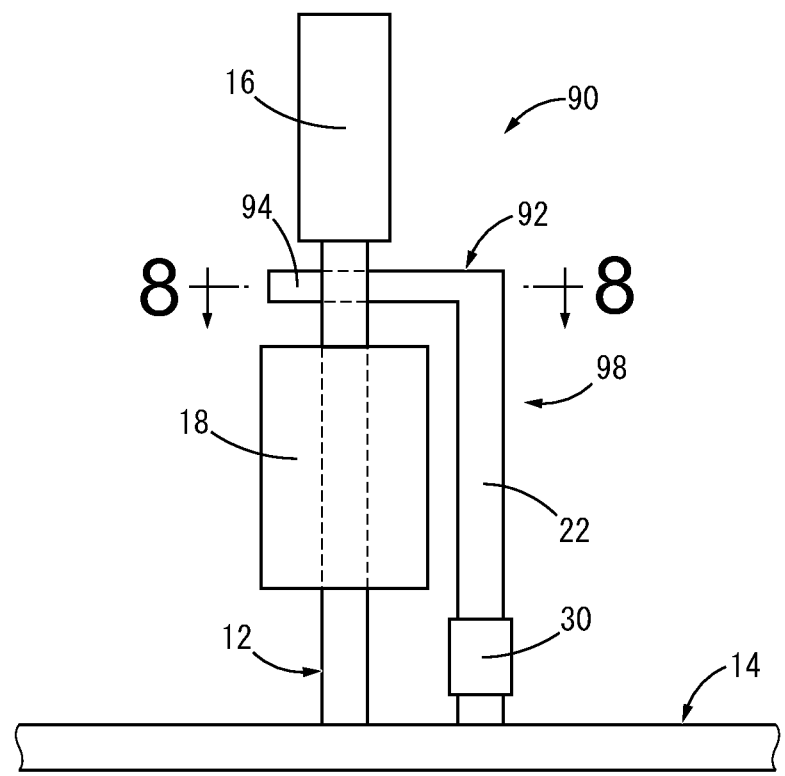
FIG. 7 is a front view schematically showing a magnetostrictive vibration power generation device as a fifth embodiment of the present invention.
Figure 8:
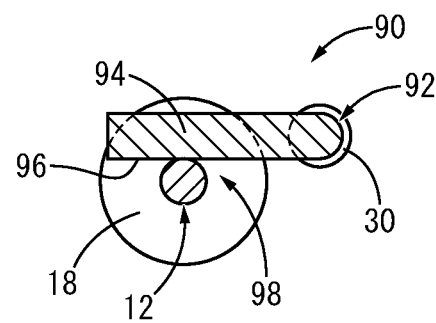
FIG. 8 is a cross section view taken along line 8-8 of FIG. 7.

FIG. 7 and FIG. 8 show a magnetostrictive vibration power generation device 90 as a fifth embodiment of the present invention. The vibration power generation device 90 is constituted including a yoke member 92 formed using a magnetic material, and the yoke member 92 is equipped with the rod shaped main unit part 22 arranged in parallel at the side of the magnetostrictive element 12 and extending vertically, and a projecting part 94 projecting to the side from the top end of the main unit part 22. As shown in FIG. 8, with the projecting part 94, a side surface 96 is slidably in contact with the outer circumference surface of the magnetostrictive element 12, and the top end part of the yoke member 92 is allowed to be relatively displaced in relation to the magnetostrictive element 12. With the vibration power generation device 90, a closed magnetic path 98 is constituted from the magnetostrictive element 12, the yoke member 92, and the vibrating member 14.

With this kind of vibration power generation device 90 as well, with the top end part of the yoke member 92, relative displacement is allowed in relation to the magnetostrictive element 12, so during deformation of the magnetostrictive element 12 by vibration input, deformation of the yoke member 92 is reduced or avoided, and it is possible to avoid damage to the permanent magnet 30 attached to the yoke member 92.

In fact, since the projecting part 94 of the yoke member 92 is in sliding contact so as to be capable of relative displacement in relation to the magnetostrictive element 12, formation of a magnetic gap with the closed magnetic path 98 is avoided, and it is possible to apply an effective bias magnetic field using the permanent magnet 30 with a weak magnetic force. As is clear from the constitution of this embodiment, the magnetostrictive element and the yoke member do not necessarily have to be separated with a gap, and as long as it is a mode for which relative displacement is possible, one side of the magnetic path lengthwise direction of the yoke member can abut the magnetostrictive element.

Figure 9:
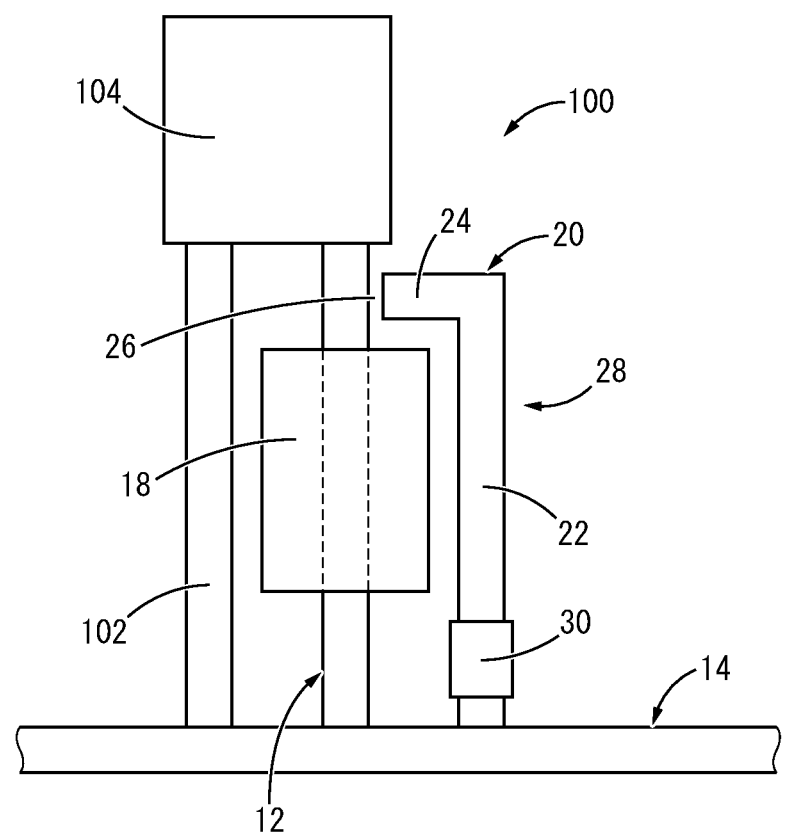
FIG. 9 is a front view schematically showing a magnetostrictive vibration power generation device as a sixth embodiment of the present invention.

FIG. 9 shows a magnetostrictive vibration power generation device 100 as a sixth embodiment of the present invention. The vibration power generation device 100 has a constitution for which a rod member 102 as a rigid member is arranged in parallel with the magnetostrictive element 12 in relation to the vibration power generation device 10 of the first embodiment. The rod member 102 is a highly rigid member formed using a nonmagnetic material, and is a separate unit from the yoke member 20, and is arranged at the side opposite the yoke member 20 in relation to the magnetostrictive element 12, and extends roughly in parallel with the magnetostrictive element 12. The rod member 102 preferably has the deformation rigidity made to be larger than that of the magnetostrictive element 12 so that bending deformation does not occur easily.

Also, while the bottom end part of the rod member 102 is fixed to the vibrating member 14, the magnetostrictive element 12 and the top end surface of the rod member 102 are both adhered as coupling members to a mass member 104. By doing this, the bottom end part of the rod member 102 is coupled to the magnetostrictive element 12 via the vibrating member 14, and the top end part of the rod member 102 is coupled to the magnetostrictive element 12 via the mass member 104. The mass member 104 is a member formed with a high specific gravity material such as iron, the same as with the mass member 16 of the first embodiment, and is arranged above the magnetostrictive element 12 and the rod member 102 arranged in parallel.

With the vibration power generation device 100 constituted in this way, when the vibrating member 14 vibrates in the lateral direction and the mass member 104 is displaced by strong vibration, compressive force and tensile force in the axial direction act alternately along with displacement of the mass member 104 on the magnetostrictive element 12. This is probably because with the vibration power generation device 100, the magnetostrictive element 12 and the rod member 102 are separated and arranged in parallel in the vibration input direction, and the magnetostrictive element 12 is adhered at a site biased to one side of the vibration input direction in relation to the mass member 104. By doing this, the magnetic permeability of the magnetostrictive element 12 changes efficiently in relation to input in the axis-perpendicular direction, and it is possible to efficiently convert vibration energy to electric energy.

With this embodiment, an example of a constitution is shown for which the top end of the rod member 102 is fixed to the mass member 104, and the bottom end is fixed to the vibrating member 14, but for example, it is also possible to have one end or both ends of a rigid member be fixed to the side surface of the magnetostrictive element 12. Also, the rigid member is acceptable as long as it has a rigidity for which it is possible to apply compression strain and tensile strain in the axial direction overall for the magnetostrictive element 12, and it is possible to form using a material and shape for which deformation is allowed.

Figure 10:
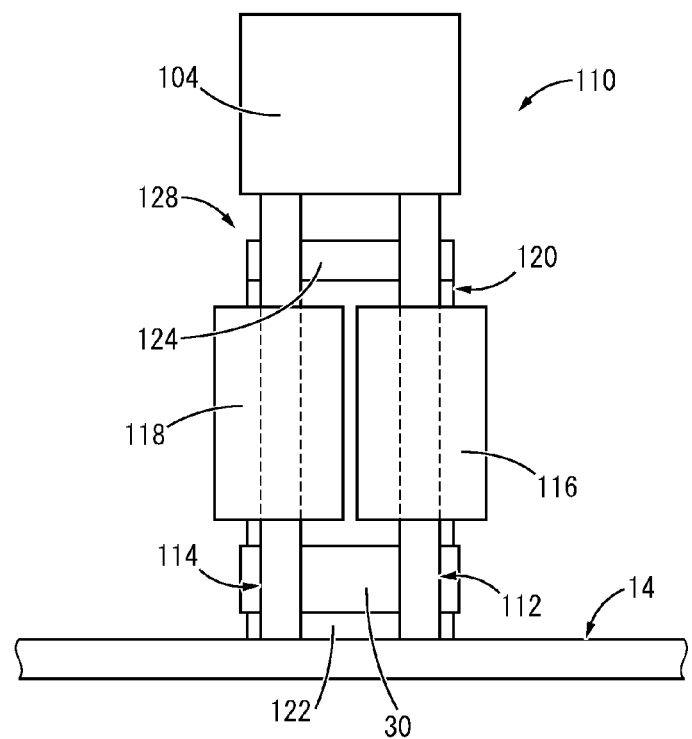
FIG. 10 is a front view schematically showing a magnetostrictive vibration power generation device as a seventh embodiment of the present invention.
Figure 11:
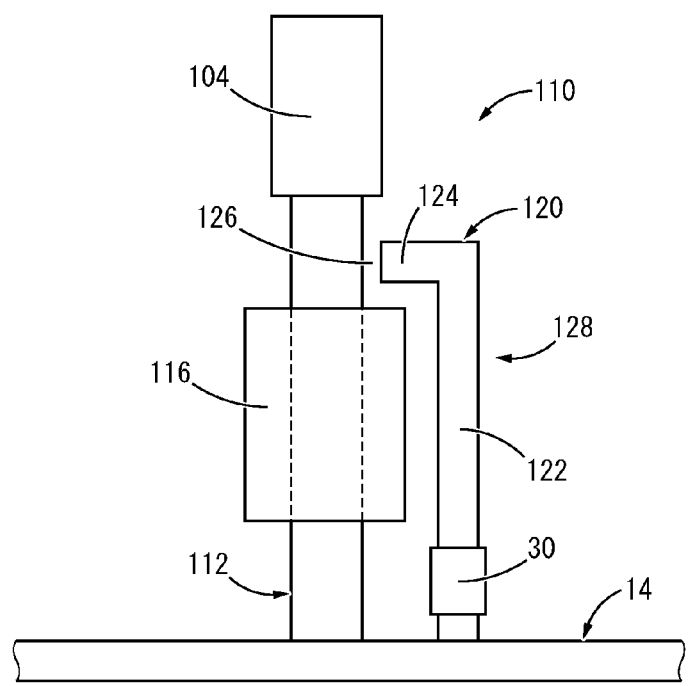
FIG. 11 is a right side view of the magnetostrictive vibration power generation device shown in FIG. 10.

FIG. 10 and FIG. 11 show a magnetostrictive vibration power generation device 110 as a seventh embodiment of the present invention. The vibration power generation device 110 has a first magnetostrictive element 112 as the magnetostrictive element and a second magnetostrictive element 114 as the magnetostrictive element mutually separated and arranged roughly in parallel.

Specifically, the first magnetostrictive element 112 is formed with a magnetostrictive material such as of the iron family or the like the same as with the magnetostrictive element 12 of the first embodiment, it has a roughly rectangular plate shape that is long in the vertical direction, and a first coil 116 is wound on the center part in the lengthwise direction the same as with the coil 18 with the first embodiment. The second magnetostrictive element 114 is roughly the same member as the first magnetostrictive element 112, and a second coil 118 that is roughly the same as the first coil 116 is wound on the center part of the long direction. The first coil 116 and the second coil 118 are wound in reverse to each other.

Specifically, the first magnetostrictive element 112 and the second magnetostrictive element 114 both have their bottom end fixed to the vibrating member 14, and the top end fixed to the mass member 104, with the bottom end parts coupled to each other via the vibrating member 14, and the top end parts coupled to each other via the mass member 104.

Also, at the side of the first magnetostrictive element 112 and the second magnetostrictive element 114, a yoke member 120 is arranged in parallel. The yoke member 120 is formed from a magnetic material such as iron or the like, and is constituted including a plate shaped main unit part 122 extending vertically, and a projecting part 124 projecting toward the first and second magnetostrictive elements 112 and 114 from the top end of the main unit part 122. This projecting part 124 is separated at the side having a designated gap 126 in relation to both the first and second magnetostrictive elements 112 and 114. Also, a closed magnetic path 128 is constituted including the first and second magnetostrictive elements 112 and 114, the yoke member 120, and the vibrating member 14, and a bias magnetic field is applied to the closed magnetic path 128 by the permanent magnet 30.

In the mounted state of the vibration power generation device 110 constituted in this way, when vibration is input in the lateral direction (the lateral direction in FIG. 10) from the vibrating member 14, the mass member 104 is forcibly vibrated, and compressive force in the axial direction is applied to one of the first magnetostrictive element 112 and the second magnetostrictive element 114, and tensile force in the axial direction is applied to the other of the first magnetostrictive element 112 and the second magnetostrictive element 114. By doing this, change occurs in the magnetic permeability for both the first magnetostrictive element 112 and the second magnetostrictive element 114, so induced electromotive force occurs at the first and second coils 116 and 118, and the vibration energy of the vibrating member 14 is converted to electrical energy and extracted. With this embodiment, changes in magnetic permeability and induced electromotive force based on that occurs at both the first and second magnetostrictive elements 112 and 114, so it is possible to efficiently convert vibration energy to electric energy and extract it.

In fact, since the first and second magnetostrictive elements 112 and 114 are separated in the vibration input direction and arranged in parallel, along with displacement of the mass member 104, compressive force in the axial direction is applied roughly overall to one of the first and second magnetostrictive elements 112 and 114, and tensile force in the axial direction is applied roughly overall to the other of the first and second magnetostrictive elements 112 and 114. Because of that, changes in the magnetic permeability occur efficiently with the magnetostrictive elements 112 and 114, and the energy conversion efficiency is improved. With this embodiment, the first and second magnetostrictive elements 112 and 114 also function as rigid members. In other words, the rigid members can also be equipped with a function as a power generating element formed with a magnetostrictive material.

Figure 12:
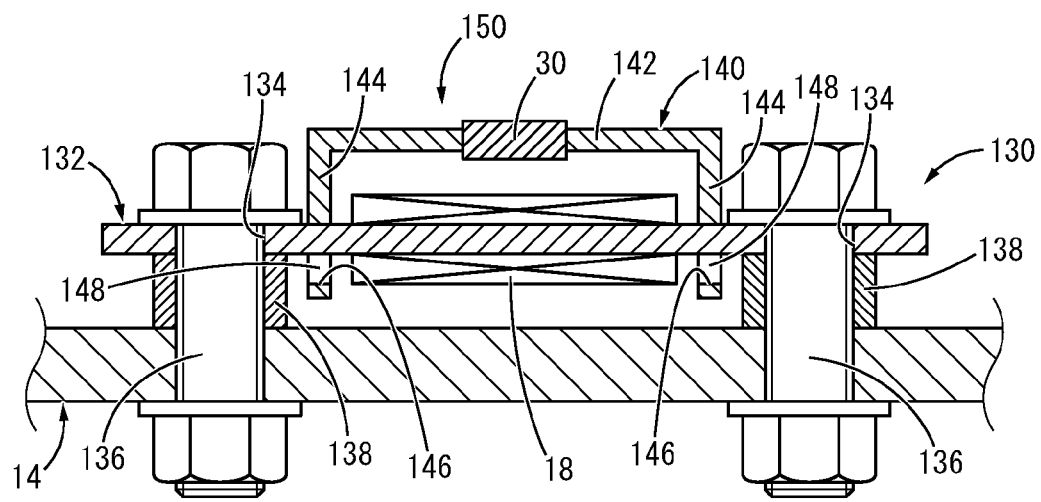
FIG. 12 is a front view schematically showing a magnetostrictive vibration power generation device as an eighth embodiment of the present invention.

FIG. 12 shows a magnetostrictive vibration power generation device 130 as an eighth embodiment of the present invention. The vibration power generation device 130 is constituted including a long plate shaped magnetostrictive element 132.

The magnetostrictive element 132 is a long plate shaped member formed using a magnetostrictive material, and has bolt holes 134 formed by piercing through in the plate thickness direction at both end parts in the long direction. Also, at the lengthwise direction center part of the magnetostrictive element 132, the coil 18 is wound. Also, the magnetostrictive element 132 is arranged roughly in parallel to the vibrating member 14, and both end parts are fixed to the vibrating member 14 by attachment bolts 136 inserted through the bolt holes 134. Tube shaped spacers 138 are interposed between the opposed surfaces of the magnetostrictive element 132 and the vibrating member 14, are arranged on the same central axis as the bolt hole 134, and the magnetostrictive element 132 is arranged separated from and in opposition above the vibrating member 14. With this embodiment, the vibrating member 14, the attachment bolts 136, and the spacers 138 are all formed using a nonmagnetic material.

Also, a yoke member 140 is attached to the magnetostrictive element 132. The yoke member 140 is formed using a magnetic material, and is integrally equipped with a main unit part 142 that is separated at the side (upward in FIG. 12) of the magnetostrictive element 132 and expanding roughly in parallel, and a pair of projecting parts 144, 144 that project toward the magnetostrictive element 132 at both end parts of the main unit part 142. Furthermore, insertion holes 146 that pierce through the lengthwise direction of the main unit part 142 are formed on the projecting parts 144. This insertion holes 146 have a hole cross section shape for which the magnetostrictive element 132 can be inserted through having a gap 148. The main unit part 142 of the yoke member 140 is divided in two in the long direction, and the permanent magnet 30 is interposed at the center in the long direction.

Also, with the yoke member 140, in a state with the magnetostrictive element 132 inserted through the insertion holes 146, 146 of the projecting parts 144, 144, by having the magnetostrictive element 132 attached to the vibrating member 14, this is attached undetachably to the magnetostrictive element 132. By doing this, a closed magnetic path 150 is constituted by the magnetostrictive element 132 and the yoke member 140, and a bias magnetic field is applied to the closed magnetic path 150 by the magnetic flux of the permanent magnet 30 attached to the yoke member 140. In light of that, by having a gap 148 formed between the outer circumference surface of the magnetostrictive element 132 and the inner circumference surface of the insertion holes 146, relative displacement of the yoke member 140 in relation to the magnetostrictive element 132 is allowed at both end parts of the yoke member 140. The volume of relative displacement in the lengthwise direction (lateral direction in FIG. 12) of the yoke member 140 in relation to the magnetostrictive element 132 is restricted by abutting of the projecting parts 144 on the attachment bolts 136. Furthermore, the distance between the projecting parts 144 and the attachment bolts 136 is smaller than the distance between the projecting parts 144 and the coil 18, and abutting of the projecting parts 144 and the coil 18 is prevented.

With this kind of vibration power generation device 130, when the vibrating member 14 is deformed by external force, compelling force is input to the magnetostrictive element for with both end parts in the lengthwise direction are fixed to the vibrating member 14, and since the magnetostrictive element 132 is deformed, electric energy is extracted as induced electromotive force flowing to the coil 18 based on changes in magnetic permeability of the magnetostrictive element 132. In particular, both end parts of the magnetostrictive element 132 are fixed to the vibrating member 14, and since the magnetostrictive element 132 is forcibly deformed along with deformation of the vibrating member 14, the effect on the frequency of the input vibration on the power generating efficiency is reduced, and it is possible to obtain electric energy stably.

Also, since relative displacement of the yoke member 140 in relation to the magnetostrictive element 132 is allowed, even when the magnetostrictive element 132 is deformed, the yoke member 140 does not follow that and deform, so distortion of the permanent magnet 30 attached to the yoke member 140 is reduced. In particular with this embodiment, at both end parts of the magnetic path lengthwise direction of the closed magnetic path 150, relative displacement of the yoke member 140 in relation to the magnetostrictive element 132 is allowed, so deformation of the yoke member 140 following deformation of the magnetostrictive element 132 is more effectively prevented, and damage to the permanent magnet 30 is advantageously avoided.

Figure 13:
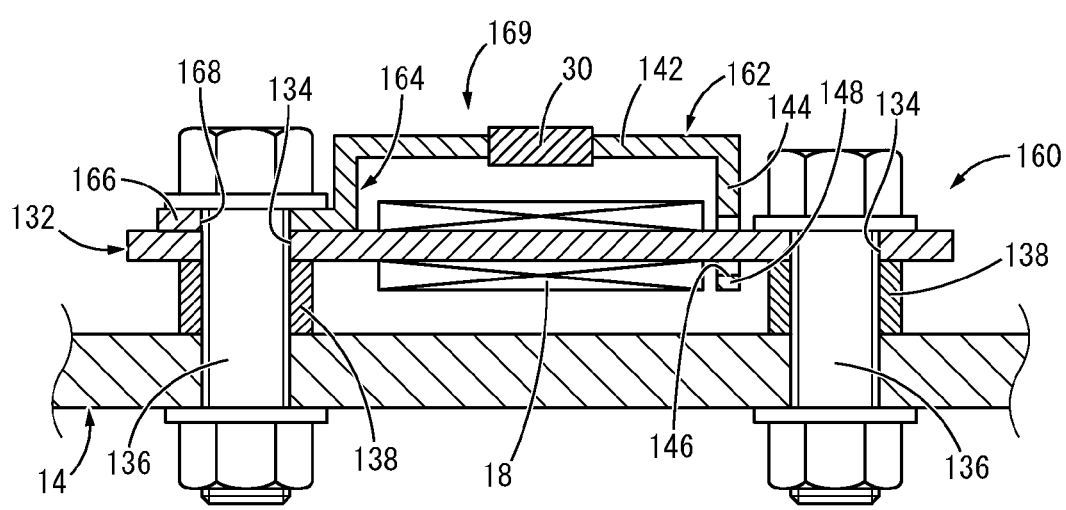
FIG. 13 is a front view schematically showing a magnetostrictive vibration power generation device as a ninth embodiment of the present invention.

FIG. 13 shows a magnetostrictive vibration power generation device 160 as a ninth embodiment of the present invention. The vibration power generation device 160 is equipped with a yoke member 162. The yoke member 162 is formed using a magnetic material, and is integrally equipped with a projecting part 144 projecting from one end in the lengthwise direction of the main unit part 142, and an attachment part 164 projecting from the other end part in the lengthwise direction of the main unit part 142.

The attachment part 164 projects toward the magnetostrictive element 132 from the main unit part 142, and a support piece 166 projecting to the outside in the lengthwise direction is integrally formed on the projecting end part at the magnetostrictive element 132 side and overlapped on the magnetostrictive element 132. Also, attachment bolts 136 are inserted through bolt holes 168 formed by piercing through the support piece 166, the support piece 166 is fixed together with the magnetostrictive element 132 to the vibrating member 14, and thus, a closed magnetic path 169 is constituted including the magnetostrictive element 132 and the yoke member 162, and a bias magnetic field is applied to the closed magnetic path 169 by the magnetic flux of the permanent magnet 30. The magnetostrictive element 132 is inserted through the insertion hole 146 of the projecting part 144 having a gap 148, one end part (the right end part in FIG. 13) in the lengthwise direction of the yoke member 162 is allowed to have relative displacement in relation to the magnetostrictive element 132, and the other end part (the left end part in FIG. 13) in the lengthwise direction of the yoke member 162 is relatively aligned in relation to the magnetostrictive element 132.

With this kind of vibration power generation device 160 as well, the same as with the vibration power generation device 130 shown with the eighth embodiment, the magnetostrictive element 132 is forcibly deformed following the deformation of the vibrating member 14, so the effect by the input vibration frequency on the deformation volume of the magnetostrictive element 32 is inhibited, and it is possible to realize stable power generating efficiency. In fact, even if there is bend deformation of the magnetostrictive element 132 following the deformation of the vibrating member 14, the yoke member 162 does not deform following the magnetostrictive element 132, and damage to the permanent magnet 30 by deformation of the yoke member 162 is avoided.

In fact, the other end part in the lengthwise direction of the yoke member 162 is aligned with the magnetostrictive element 132, so the relative displacement of the yoke member 162 in relation to the magnetostrictive element 132 is restricted, and striking noise due to abutting of the magnetostrictive element 132 and the yoke member 162 is avoided.

Figure 14:
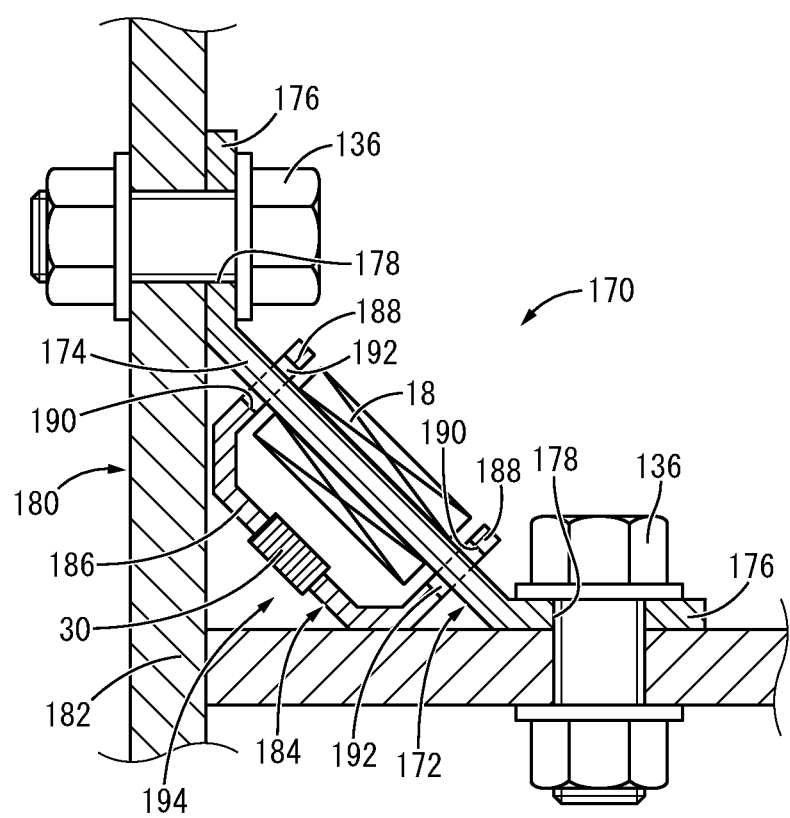
FIG. 14 is a front view schematically showing a magnetostrictive vibration power generation device as a tenth embodiment of the present invention.

FIG. 14 shows a magnetostrictive vibration power generation device 170 as a tenth embodiment of the present invention. The vibration power generation device 170 is equipped with a magnetostrictive element 172. The magnetostrictive element 172 is a long plate shaped member formed using a magnetostrictive material, and is integrally equipped with a deformation allowance part 174 constituting the center part in the lengthwise direction, and a pair of attachment end parts 176, 176 provided at both ends of the deformation allowance part 174 and relatively slanted in relation to the deformation allowance part 174. Furthermore, bolt holes 178 that pierce through the respective thickness direction are formed on the pair of attachment end parts 176, 176. The coil 18 is wound on the deformation allowance part 174.

This magnetostrictive element 172 is attached to a vibrating member 180 having a roughly L shaped cross section. The vibrating member 180 is equipped with two parts roughly orthogonal to each other sandwiching a bent part 182, and one attachment end part 176 of the magnetostrictive element 172 is fixed by a bolt to one of the parts of the vibrating member 180, while the other attachment end part 176 of the magnetostrictive element 172 is fixed by a bolt to the other part of the vibrating member 180. By doing this, with the magnetostrictive element 172, a deformation allowance part 174 is arranged straddling at a slant to the bent part 182 of the vibrating member 180, so that deformation is allowed in the thickness direction of the deformation allowance part 174.

Also, a yoke member 184 is attached to the magnetostrictive element 172. The yoke member 184 is integrally equipped with a main unit part 186 that is a long plate shape separated at the side of the magnetostrictive element 172 and arranged aligned roughly in parallel, and a pair of plate shaped projecting parts 188, 188 projecting toward the magnetostrictive element 172 at both ends of the main unit part 186. Insertion holes 190 that pierce through the thickness direction are formed on the projecting parts 188. The main unit part 186 is divided at the center part in the lengthwise direction, and the permanent magnet 30 is interposed between each of those divided parts.

Also, by the deformation allowance part 174 of the magnetostrictive element 172 being inserted through the insertion holes 190 of the projecting parts 188, the yoke member 184 is attached in a mode for which relative displacement is allowed in relation to the magnetostrictive element 172. By doing this, a closed magnetic path 194 of this embodiment is constituted by the magnetostrictive element 172 and the yoke member 184, and a bias magnetic field is applied to the closed magnetic path 194 by the magnetic flux of the permanent magnet 30. With this embodiment, the yoke member 184 abuts the vibrating member 180 without being adhered, and relative displacement of the yoke member 184 in relation to the vibrating member 180 is allowed, but for example, it is also possible to fix this using a means such as welding, adhesion, locking or the like.

With this kind of vibration power generation device 170, when the vibrating member 180 is deformed so as to have the angle of the bent part 182 be changed by vibration input, the deformation allowance part 174 of the magnetostrictive element 172 that straddles both sides sandwiching the bent part 182 is deformed. By doing this, induced electromotive force is generated at the coil 18 based on changes in magnetic permeability of the magnetostrictive element 172 and the vibration energy can be extracted as electric energy. In fact, both end parts of the magnetostrictive element 172 are fixed to the vibrating member 180, and when the vibrating member 180 is deformed, the deformation allowance part 174 of the magnetostrictive element 172 is forcibly deformed, so changing of the power generation efficiency according to the frequency of the input vibration is prevented, and stable power generation is realized.

Also, the magnetostrictive element 172 is inserted through the insertion holes 190 of the yoke member 184 having a gap 192, and relative displacement of the yoke member 184 in relation to the magnetostrictive element 172 is allowed. By doing this, deformation of the yoke member 184 when the magnetostrictive element 172 deforms is prevented, and damage to the permanent magnet 30 attached to the yoke member 184 is avoided.

Figure 15:
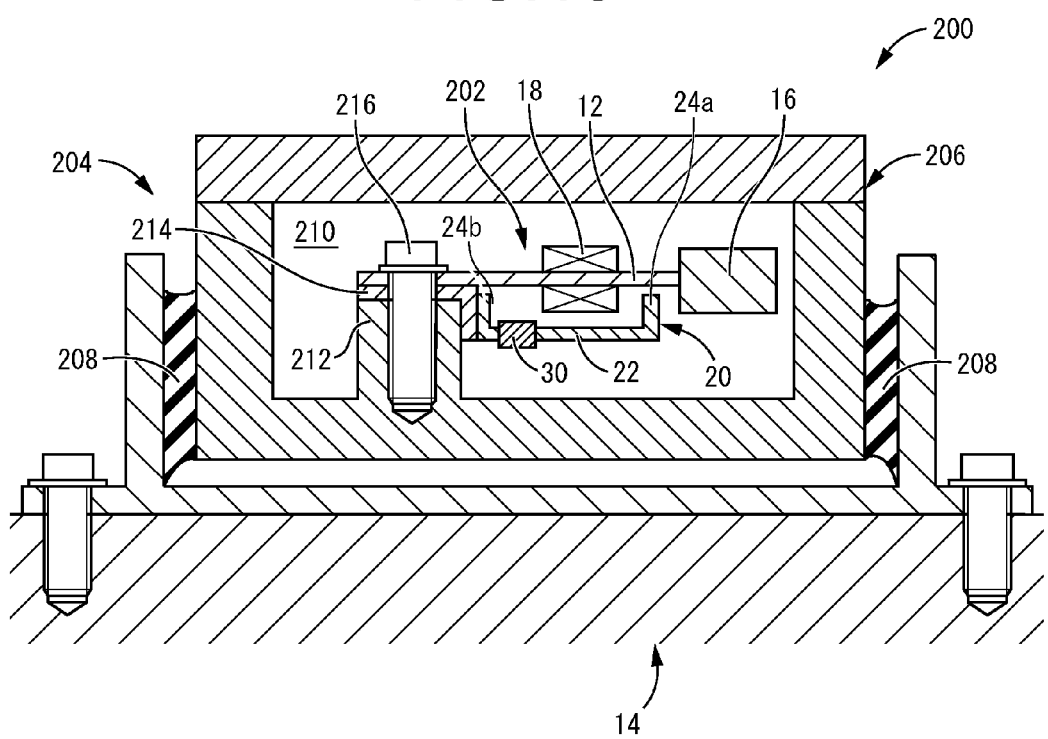
FIG. 15 is a cross section view schematically showing a magnetostrictive vibration power generation device as an eleventh embodiment of the present invention.

FIG. 15 shows a magnetostrictive vibration power generation device 200 as an eleventh embodiment of the present invention. The vibration power generation device 200 of this embodiment constitutes a two degrees of freedom vibration system for which a first vibration system 202 and a second vibration system 204 are provided in series on the vibration transmission path for which vibration is applied from the vibrating member 14.

The first vibration system 202 has a basic structure that is roughly the same as the vibration power generation device of the first embodiment, so by giving code numbers corresponding to the first embodiment to each member in FIG. 15, we will omit a detailed description. Specifically, the first vibration system 202 has a structure that uses the magnetostrictive element 12 as the spring member supported by a cantilever structure with one end fixed and the other end being free, and for which the mass member 16 is integrally provided at the free end of the tip end side of the magnetostrictive element 12.

Also, the yoke member 20 that forms the closed magnetic path working together with the magnetostrictive element 12 is arranged in parallel at a position separated from the magnetostrictive element 12, and both end parts in its lengthwise direction are closed to the magnetostrictive element 12. Also, both end parts of the lengthwise direction of the yoke member 20 are used as projecting parts 24*a* and 24*b* arranged in opposition to the magnetostrictive element 12 via a designated magnetic gap.

By the existence of this magnetic gap, while maintaining the closed magnetic path constituted by the magnetostrictive element 12 and the yoke member 20, the deformation displacement in the vertical direction of the magnetostrictive element 12 in FIG. 15 is allowed easily without constriction by the yoke member 20. Also, the bias magnetic flux by the permanent magnet 30 arranged on the yoke member 20 is always applied to the magnetostrictive element 12.

Meanwhile, with the second vibration system 204, by a base member 206 as a mass member being elastically coupled to the vibrating member 14 by a rubber elastic body 208 as a spring member, a mass-spring vibration system is constituted with the base member 206 as the mass and the rubber elastic body 208 as the spring. Also, one end part of the magnetostrictive element 12 constituting the first vibration system 202 is fixed to this base member 206, and the yoke member 20 is also supported by being fixed by the base member 206.

Also, with this embodiment, by the base member 206 being a hollow structure, a housing space 210 which is roughly cut off in relation to the external space is formed. Also, the first vibration system 202 is arranged in a housed state in this housing space 210. Specifically, the base member 206 is formed from a hard material with a high specific gravity such as metal or the like, and the housing space 210 enclosed by a thick wall part is equipped. A support base 212 projecting from the internal bottom surface is formed on this housing space 210, and on the top end surface of this support base 212, the base end part of the magnetostrictive element 12 is overlapped sandwiching a bracket 214 and fixed by a bolt 216.

By doing this, inside the housing space 210, the magnetostrictive element 12 is arranged with a cantilever structure extending to the side from the support base 212, and the yoke member 20 extending roughly parallel to the side of the magnetostrictive element 12 is supported by being fixed to the support base 212 via the bracket 214.

With the vibration power generation device 200 constituted in this way, the first vibration system 202 and the second vibration system 204 are provided in series on the vibration transmission path transmitted from the vibrating member 14, and the input vibration from the vibrating member 14 is applied to the first vibration system 202 via the vibration of the second vibration system 204 so that the magnetostrictive element 12 is vibrated and deformed. Because of that, compared to when the base end side of the magnetostrictive element 12 is directly fixed to the vibrating member 14 to be attached, it is possible to use the vibration of the second vibration system 204. Also, by using the vibration amplifying effect by the resonance or the like of the second vibration system 204, a vibration larger than that of the vibration of the vibrating member is applied to the magnetostrictive element, and it is possible to obtain a larger power generating volume.

More preferably, the natural frequency f1 of the first vibration system 202 is set so as to satisfy the formula below in relation to the natural frequency f2 of the second vibration system 204. By doing this, efficiently using the combined vibration of the first vibration system 202 and the second vibration system 204, the vibration magnification of the magnetostrictive element 12 can be set even higher, and it becomes possible to more efficiently apply a large vibration deformation to the magnetostrictive element in relation to input vibration in a wide frequency range or in a plurality of frequency ranges.

$$(-f2) \times \sqrt{2} \leq f1 \leq (+f2) \times \sqrt{2}$$

The natural frequency f1 of the first vibration system 202 can be tuned for example by adjusting the spring constant by the length, cross section shape or the like of the magnetostrictive element 12, adjusting the mass of the mass member 16 or the like. Also, the natural frequency f2 of the second vibration system 204 can be tuned for example by adjusting the spring constant by the material or capacity, the free length, or the shearing deformation and compression deformation ratio or the like during vibration input for the rubber elastic body 208, by adjusting the mass of the base member 206 or the like.

Above, we gave a detailed description of embodiments of the present invention, but the present invention is not limited to those specific descriptions. For example, the magnetostrictive element can be rod shaped or plate shaped as long as it is longitudinal.

Also, the permanent magnet can be attached to the yoke member on the closed magnetic path, or for example can also be attached to the projecting part 24 of the first embodiment or the coupling support part 74 of the third embodiment or the like. Furthermore, the fixing method of the permanent magnet to the yoke member is not particularly limited, and it is not absolutely necessary to have the yoke member have a divided structure that is fixed so as to sandwich the permanent magnet.

Also, the direction in which the projecting part of the yoke member is in opposition with a gap to, or is slidably in contact with the magnetostrictive element is necessarily limited to being the axis-perpendicular direction of the magnetostrictive element, and for example, it is also possible to have the mass member 16 formed using a magnetic material, to have the projecting part of the yoke member face opposite the top surface of the mass member 16 having a gap, or to abut so as to be able to slide.

With the embodiments noted above, when a gap is formed between the projecting part and the magnetostrictive element, depending on the strength of the permanent magnet or the strength of the bias magnetic field required or the like, it is also possible to set the gap size so as to have the magnetostrictive element and the projecting part abut in the normal vibration state of the vibrating member.

Also, this is not limited to necessarily having only one magnetostrictive vibration power generation device for one vibrating member, and it is also possible to provide a plurality of magnetostrictive vibration power generation devices.

Yet further, with the magnetostrictive vibration power generation device 200 as the eleventh embodiment noted above, a two degrees of freedom vibration system was constituted by serially interposing and arranging one mass-spring vibration system between the vibrating member 14 and the first vibration system 202 including the magnetostrictive element 12, but for example it is also possible to constitute a multi freedom level vibration system of three degrees of freedom or greater by serially interposing and arranging plurality of mass-spring vibration systems between the vibrating member 14 and the first vibration system 202, for example.

Furthermore, with the mass member constituting the second vibration system 204, rather than using the hollow structure as shown with the base member 206 of the eleventh embodiment noted above, it is also possible to use a mass member with a solid block structure, and to arrange the first vibration system 202 on its outer circumference surface. When arranging the first vibration system 202 on the outer circumference surface of the base member 206, it is possible to also use a cover member such as a dome structure or the like to cover the outside of the first vibration system 202 as necessary.

Also, the magnetostrictive vibration power generation device shown in the first to eleventh embodiments noted above can also be constituted by combining with various electrical devices made to operate using the power obtained by it. In specific terms, for example by combining the magnetostrictive vibration power generation device described above with a light emitting device such as a sidelight or taillight or the like of a car, for example, it is possible to constitute a private power generating illumination device that does not require wiring from the vehicle battery. Also, by combining the magnetostrictive vibration power generation device of the present invention that generates electricity using the vibration of the floor or road surface of a house, road or the like with a light emitting device for indoor or outdoors, using the vibration energy that comes with people walking or a car running or the like, it is also possible to constitute an illumination device for safety and auxiliary use during a power outage or the like. Yet further, for example by combining a sensor device such as a temperature sensor or the like that requires operating power with the magnetostrictive vibration power generation device described above, it is possible to constitute a private power generating sensor device that does not require wiring from an outside power source. Furthermore, by combining a wireless transmission device with the magnetostrictive vibration power generation device described above, for example, it becomes possible to also not need external power supply when wirelessly transmitting sensor detection signals or the like.

Yet further, the vibrating member to which is attached the magnetostrictive vibration power generation device constituted according to the present invention is not particularly restricted, and for example in addition to being a vehicle body or power unit or the like, a home appliance such as a washing machine or the like, or a bridge or the like can also be used as a vibrating member for supplying vibration energy.

What is claimed is:

1. A magnetostrictive vibration power generation device comprising:
    a longitudinal magnetostrictive element formed of a magnetostrictive material and configured to be attached to a vibrating member at at least one end part thereof;
    a coil wound on a closed magnetic path constituted including the magnetostrictive element; and
    a permanent magnet arranged so as to apply a bias magnetic field to the closed magnetic path, wherein
    the magnetostrictive element is subjected to vibration from the vibrating member in a direction of bending deformation,
    a yoke member formed of a magnetic material is arranged in parallel at a side of the magnetostrictive element, and the closed magnetic path is formed including the magnetostrictive element and the yoke member,
    the permanent magnet is attached to the yoke member on the closed magnetic path,
    the yoke member is allowed relative displacement in an axis-perpendicular direction in relation to the magnetostrictive element on at least one side in a magnetic path lengthwise direction of the closed magnetic path, and
    the yoke member is arranged in relation to an outer circumference surface of the magnetostrictive element in a state where, during the relative displacement, a distance between parts of the yoke member and the magnetostrictive element that transmit magnetic flux is kept constant.

2. The magnetostrictive vibration power generation device according to claim 1, wherein a projecting part that projects toward the magnetostrictive element on the closed magnetic path is provided on the yoke member, and the projecting part is arranged with a gap in relation to the magnetostrictive element.

3. The magnetostrictive vibration power generation device according to claim 2, wherein the gap formed between the magnetostrictive element and the projecting part has a size such that the magnetostrictive element and the projecting part are kept in a separated state during normal vibration input assumed for the vibrating member.

4. The magnetostrictive vibration power generation device according to claim 2, wherein an insertion hole is formed in the projecting part, and the magnetostrictive element is inserted through the insertion hole with the gap.

5. The magnetostrictive vibration power generation device according to claim 1, wherein a projecting part that projects toward the magnetostrictive element on the closed magnetic path is provided on the yoke member, and the projecting part is in sliding contact so as to be capable of relative displacement in relation to the magnetostrictive element.

6. The magnetostrictive vibration power generation device according to claim 1, wherein both end parts of the magnetostrictive element are configured to be attached to the vibrating member.

7. The magnetostrictive vibration power generation device according to claim 1, wherein a longitudinal rigid member separate from the yoke member is arranged in parallel at the side of the magnetostrictive element, and both end parts of the rigid member are coupled to the magnetostrictive element.

8. The magnetostrictive vibration power generation device according to claim 1, wherein a mass-spring vibration system is constituted by a mass member being configured to be coupled to the vibrating member by a rubber elastic body, and the magnetostrictive element is configured to be attached to the vibrating member via the vibration system by at least one end part of the magnetostrictive element being fixed to the mass member.

9. The magnetostrictive vibration power generation device according to claim 8, wherein a natural frequency of the magnetostrictive element is set to a frequency range of $\pm\sqrt{2}$ times in relation to a natural frequency of the mass-spring vibration system.

* * * * *